United States Patent [19]

Newman et al.

[11] Patent Number: 4,814,259
[45] Date of Patent: Mar. 21, 1989

[54] LASER GENERATED ELECTRICALLY CONDUCTIVE PATTERN

[75] Inventors: Paul R. Newman, Newbury Park; Leslie F. Warren, Jr., Camarillo; Patricia H. Cunningham, Newbury Park, all of Calif.

[73] Assignee: Rockwell International Corporation, El Segundo, Calif.

[21] Appl. No.: 118,591

[22] Filed: Nov. 9, 1987

[51] Int. Cl.$^4$ .................................................. B05D 3/06
[52] U.S. Cl. ............................ 430/319; 430/270; 430/311; 430/945; 427/53.1
[58] Field of Search ............... 430/311, 319, 325, 315, 430/326, 269, 270, 945; 427/53.1, 126.6

[56] References Cited

U.S. PATENT DOCUMENTS

| | | | |
|---|---|---|---|
| Re. 29,015 | 10/1976 | DeAngelo et al. | 430/319 |
| 3,930,963 | 1/1976 | Polichette et al. | 430/319 |
| 3,940,533 | 2/1976 | Ansac | 427/125 |
| 4,363,707 | 12/1982 | Prigent et al. | 427/126.6 |
| 4,426,442 | 1/1984 | Molenaar, et al. | 430/413 |
| 4,564,589 | 1/1986 | Hallman et al. | 430/275 |

FOREIGN PATENT DOCUMENTS

| | | | |
|---|---|---|---|
| 0052052 | 3/1982 | Japan | 430/319 |
| 1104083 | 10/1984 | Japan | 427/53.1 |

Primary Examiner—José G. Dees
Assistant Examiner—Donald J. Loney
Attorney, Agent, or Firm—H. Fredrick Hamann; Craig O. Malin

[57] ABSTRACT

A conductive or semiconductive pattern of a metal sulfide or selenide such as copper, cadmium, cobalt or nickel sulfide, is provided on a substrate. The pattern may have a resistivity in the range of 1 to $10^6$ ohms per square. It is formed by coating the surface with a solution containing a salt of one of the metals which is capable of being converted to a divalent metal compound, a sulfur group donor such as thiourea, and a solvent such as methanol or water. The solution is dried, and then selected portions of the coated surface are irradiated with a laser beam. This thermally converts the irradiated metal salt into a metal sulfide. The unreacted solution is then washed from the substrate to leave a conductive pattern. The desired conductivity of the pattern can be obtained by selecting the proper metal salt, concentration of salt in the solution, and the energy of the radiation.

15 Claims, 3 Drawing Sheets

LASER GENERATED ELECTRICALLY CONDUCTIVE PATTERN

BACKGROUND OF THE INVENTION

This invention relates to electrically conducting and semiconducting materials (including resistors) and is particularly related to electrically conductive patterns on substrates and to methods of forming such patterns.

Electrically conductive patterns are useful in many applications including electrical interconnects, circuit boards, interconnects for very large scale integrated circuits, resistive heating elements, conductors in composite structural materials, fine line conductors for semiconductors, and resistors.

In general, the fabrication of conductive patterns, particularly those requiring fine-line geometries is limited to technologies using photoresist to lift off uniformly deposited metal, or reactive etching of uniformly deposited metal films, or printing techniques using carbon-based inks. These techniques are limited in the types of substrates which are suitable, requiring smooth surfaces such as obtained with polished semiconductors or with some formed plastics and composite substrates. These prior art techniques also suffer from an inability to treat large areas (several square feet) at a time. Additionally, the electrical resistivity values that are achieved are limited, generally approaching the resistivity of the metal being used to form the pattern.

A method of coating a substrate with electrically conductive nickel sulfide is described in U.S. patent application Ser. No. 935,888 filed Nov. 28, 1986 to Leslie F. Warren, Jr. (one of the inventors of the present invention). According to the prior application, a substrate is coated with a solution of a nickel salt and a sulfur donor. The entire coated surface is then heated to provide a uniform coating of nickel sulfide on the substrate. A conducting pattern capable of fine-line geometries is not produced according to the prior application.

SUMMARY OF THE INVENTION

It is an object of the invention to provide a substrate having a fine-line, conductive or semiconductive pattern.

It is an object of the invention to provide a substrate having a conductive pattern with a selected conductivity.

It is an object of the invention to provide a method of fabricating a fine-line, conductive or semiconductive pattern on a substrate.

It is an object of the invention to provide a method of fabricating a conductive pattern having a selected conductivity.

According to the invention, a conductive or semiconductive pattern of a metal sulfide or selenide such as copper, cadmium, cobalt, or nickel sulfide or selenide is provided on a substrate. The pattern may have a sheet resistivity of from about 1 to $10^6$ ohms per square. It is formed by coating the substrate with a solution containing a salt of one of the metals which is capable of being converted to a metal sulfide or selenide, a sulfur or selenium donor such as thiourea, and a solvent such as methanol or water. The solution is dried, and then selected portions of the coated surface are irradiated with a laser beam. The beam thermally converts the irradiated metal salt into a metal sulfide or selenide by reaction with the donor. The unreacted solution is washed from the substrate to leave the conductive pattern.

Precise, fine-line geometries can be obtained with the laser. The desired conductivity of the pattern can be obtained by selecting the proper metal salt, concentration of salt in the solution, and the energy of the beam.

These and other objects and features of the invention will be apparent from the following detailed description taken with reference to the accompanying drawings.

DESCRIPTION OF THE PREFERRED EMBODIMENT

According to the invention, a substrate is coated with a solution containing a soluble nickel salt which is capable of being converted to a nickel sulfide, and a sulfur donor. In a preferred embodiment, the soluble salt is nickel acetate (or nickel acetate tetrahydrate) and the sulfur donor is thiourea.

The solution used to coat the substrate is prepared by dissolving the nickel acetate and thiourea in a solvent such as methanol and/or water. It can be applied in any convenient manner such as by dipping, by spraying, or by spin coating. The solvent may be evaporated at room temperature to leave a dry, uniform film of the reagents on the substrate.

The coated surface is then irradiated with a laser beam in those selected portions where a conductive deposit is desired. This causes a chemical reaction between the metal salt and the sulfur donor to form an insoluble conducting deposit of metal sulfide in those areas which were exposed to the radiation. In the preferred case using nickel acetate and thiourea, the idealized reaction is:

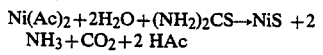

$$Ni(Ac)_2 + 2H_2O + (NH_2)_2CS \rightarrow NiS + 2 NH_3 + CO_2 + 2\ HAc$$

The by-products of this reaction are volatile and appear to leave the substrate during irradiation; thus, little or no rinsing of the substrate is required other than to remove excess unreacted reagents outside of the developed pattern.

Although the conductive deposit is referred to as nickel sulfide (NiS), it may have a polymer-like structure which is polymerized by the radiation. It is a semimetal NiS$_x$ which may have a conductivity ranging from insulating ($10^3$ ohm-cm) to metallic ($10^{-3}$ ohm-cm). Sheet resistivities in the range of about 1 to $10^6$ ohms per square should be obtainable when this material is deposited on substrates. The activation or "developing" of the solution-deposited coating into conductive material is apparently caused by the heat generated by the laser beam. The energy of a moderate laser beam (approximately 40 W/cm$^2$) is sufficient to develop the coating within 0.1 sec. Satisfactory deposits have been formed at fluences of from 1 to 25 W-sec/cm$^2$. Suitable optics may be used to focus the laser beam to any desired spot size down to the diffraction limit. The beam intensity and exposure duration can be controlled either by a shutter or an acousto-optic or electro-optic modulator.

Figure 1:
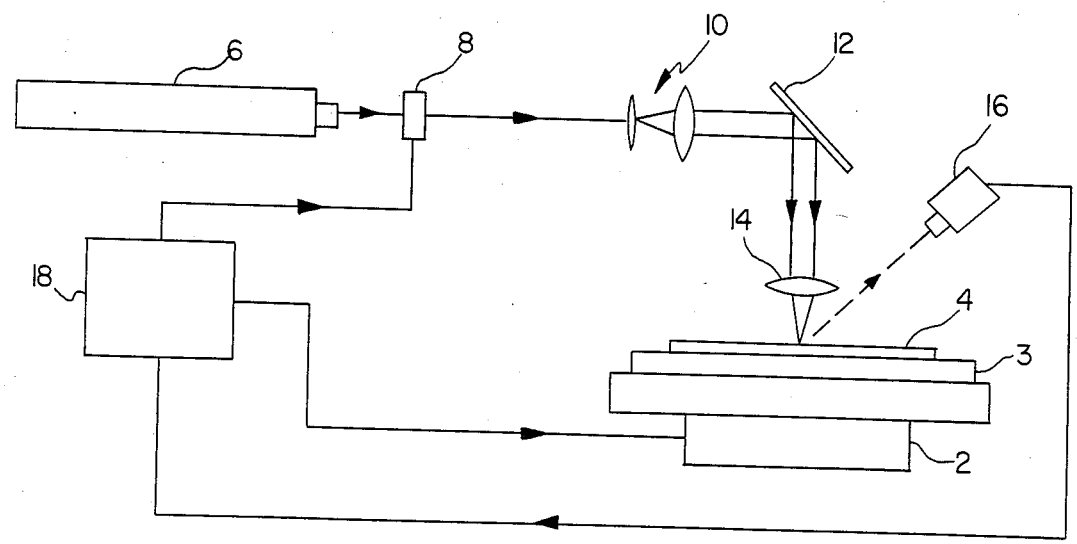
FIG. 1 is a schematic showing an x—y programmable table used to form a pattern with a laser beam.

FIG. 1 is a schematic showing a moveable stage 2 and insulator 3 for positioning a coated substrate 4 under a beam from laser 6. The intensity of the beam is controlled by a shutter or modulator 8. It then passes though an expander collumnator 10 and is reflected downward to substrate 4 by mirror 12. Before irradiating substrate 4, the beam is focussed by lens 14. Dynamic real time control of the exposure can be accomplished using an infrared detector or imager 16 and a computer 18 which interprets the detected signal and then controls the beam intensity by the adjusting modulator 8.

Figure 2:
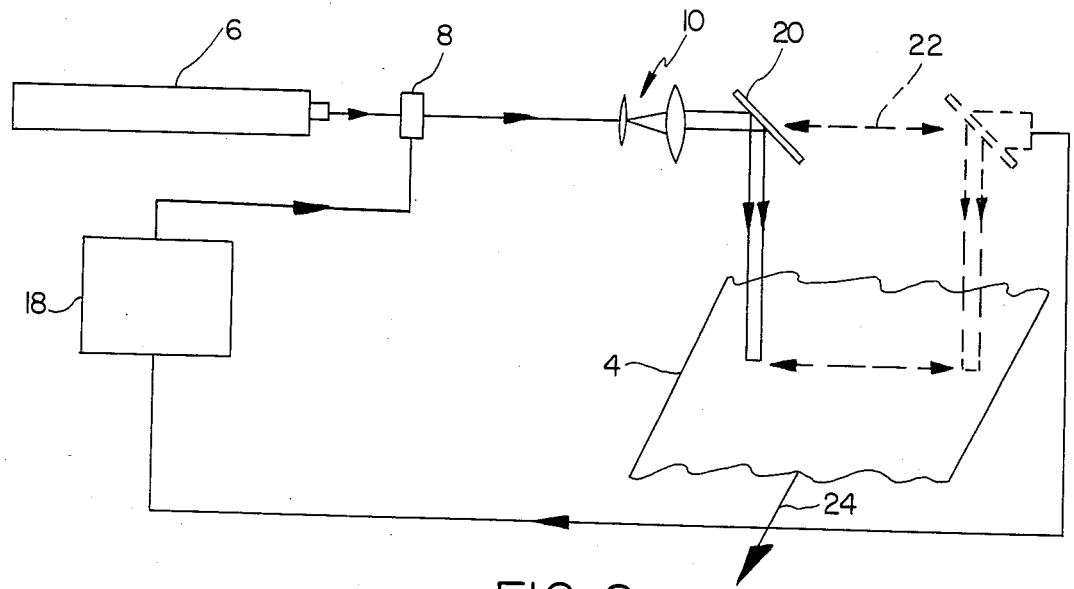
FIG. 2 is a schematic showing a translatable mirror and moving substrate used to form a pattern with a laser beam.

FIG. 2 shows another embodiment which is useful for exposing a coated substrate such as cloth 4 to a laser beam. In the FIG. 2 embodiment, a translatable mirror 20 is used to move the beam in one direction 22 while the substrate 4 is moving in another direction 24.

Figure 3:
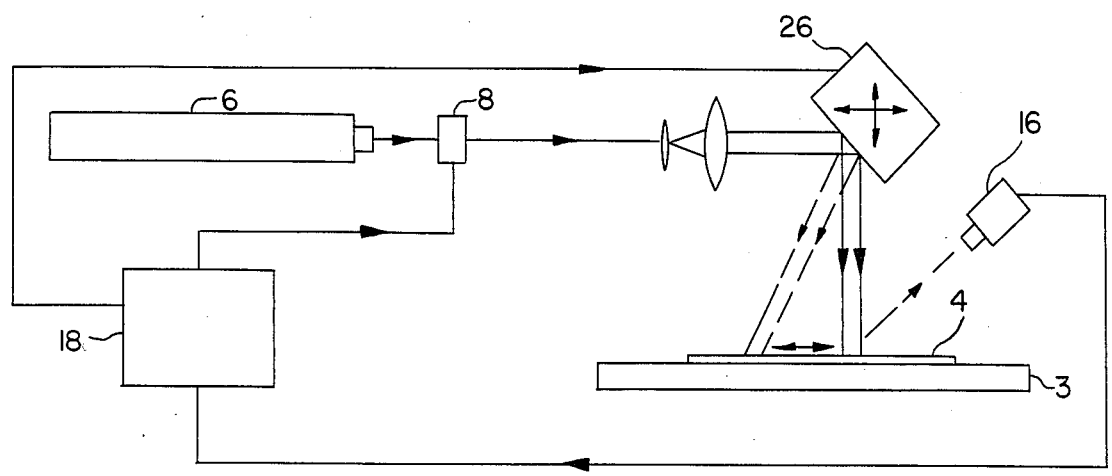
FIG. 3 shows a 2 axes mirror used to deflect a laser beam and form a pattern.
Figure 4:
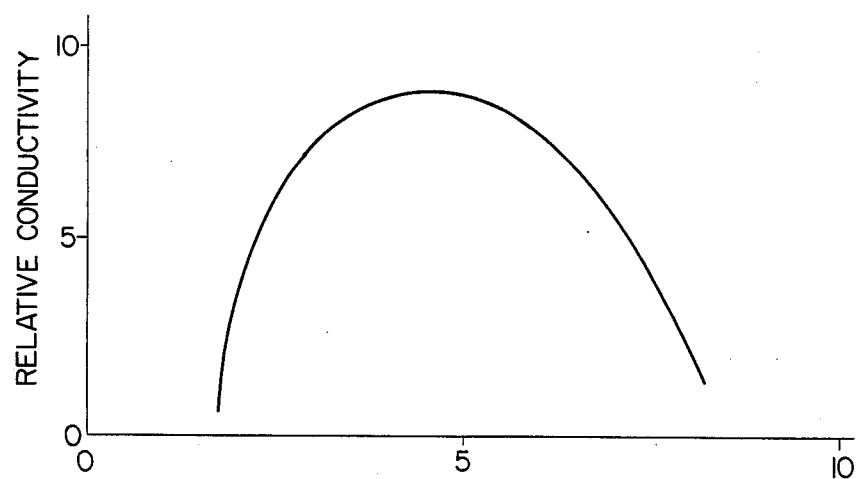
FIG. 4 is a curve of relative conductivity obtained using different laser power density.

In the FIG. 3 set-up, a two axes scanner 26 is used to deflect the laser beam across the substrate 4.

Large area substrate surfaces can be covered with conductive patterns using set-ups as illustrated above. A wide variety of substrate materials can be used such as plastics, ceramics, metals, fabrics, and circuit board composites. The conductivity can be closely controlled over a wide range by controlling the laser beam intensity, beam size, position, slew rate, exposure time, and the composition and concentration of the solution used to form the coating. This flexibility of the process is illustrated, at least in part, by the following examples.

EXAMPLE 1

A 4-inch by 4-inch sample of fiber glass (Uniglass #7781) was dipped into a methanol solution containing 0.2 M each of nickel acetate tetrahydrate and thiourea. The swatch was removed from the solution and dried at room temperature with a fan. The fabric was then positioned on a laser table and a section was irradiated with a CO$_2$ laser beam at 40 W/cm$^2$ for 0.1 second. A dark deposit of conducting nickel sulfide formed on the cloth fibers in the rrecise pattern of the laser beam. The pattern edges were very sharp.

The sample was washed in water and methanol to remove unreacted reagents. Additional washing done after the first conductivity measurement shows very little loss in conductivity.

EXAMPLE 2

A 4-inch by 6-inch sheet of fiberglass reinforced Kapton was etched for 5 seconds in a chromic acid bath and rinsed with distilled water. The sheet was then coated with the solution and exposed to the laser pulse as described in Example 1. A metallic-appearing, conducting film pattern was formed on the exposed portions of the sheet. The film pattern was adherent and was not removed when the sheet was rinsed to remove the unexposed coating.

EXAMPLE 3 (FIG. 4)

To establish the relationship between power density and the resulting conductivity, samples prepared as described in Example 1 were exposed to different laser power in the range of 18–80 W/cm$^2$. The laser used was a high power CO$_2$ laser which produced a 2-inch by 2-inch square beam. The samples were exposed for 0.1 seconds at different power levels. The results are shown in FIG. 1. The relative conductivity increased to a maximum as the power was increased up to about 45 Watts/cm$^2$ (4.5 W-seconds/cm$^2$). The conductivity then began to decrease as the radiation was increased beyond this value.

Additional tests were run on the developed samples to evaluate the stability of the conducting deposit. The deposit lost very little conductivity after washing. Reheating the samples did not increase the conductivity. The washing essentially "fixes" the conducting deposit.

EXAMPLE 4 (FIG. 5)

Figure 5:
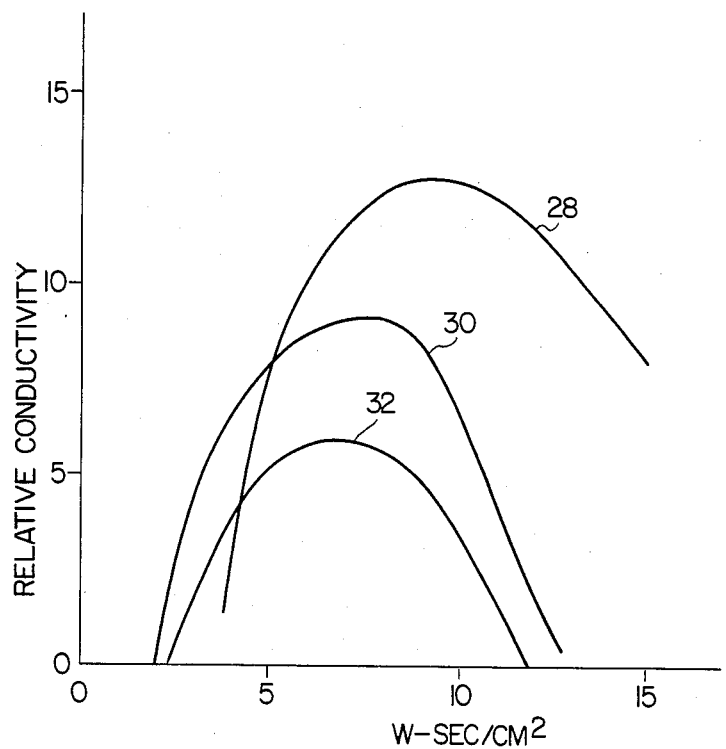
FIG. 5 shows the relative conductivity vs laser fluence (W-sec/cm$^2$) for samples made using three different concentrations of reactants.

To establish the relationship between solution concentration and the resulting conductivity, samples were prepared as described in Example 1 except that different concentrations of nickel acetate and thiourea were used. The samples were irradiated with a 3-inch by 3-inch laser beam for 0.5 seconds at power densities ranging from 5 to 30 W/cm$^2$. The results are shown in FIG. 5. The concentrations tested were: 0.2M nickel acetate/0.2M thiourea for curve 28, 0.1M nickel acetate/0.1M thiourea for curve 30, and 0.05M nickel acetate/0.05M thiourea for curve 32. These tests showed that the higher concentration results in increasing conductivity.

The samples produced at the three concentrations were also tested to determine the effect of washing and reheating. All three concentrations showed little loss in conductivity after additional washing and after reheating at 500° F. for 10 minutes.

EXAMPLE 5 (FIG. 6)

Figure 6:
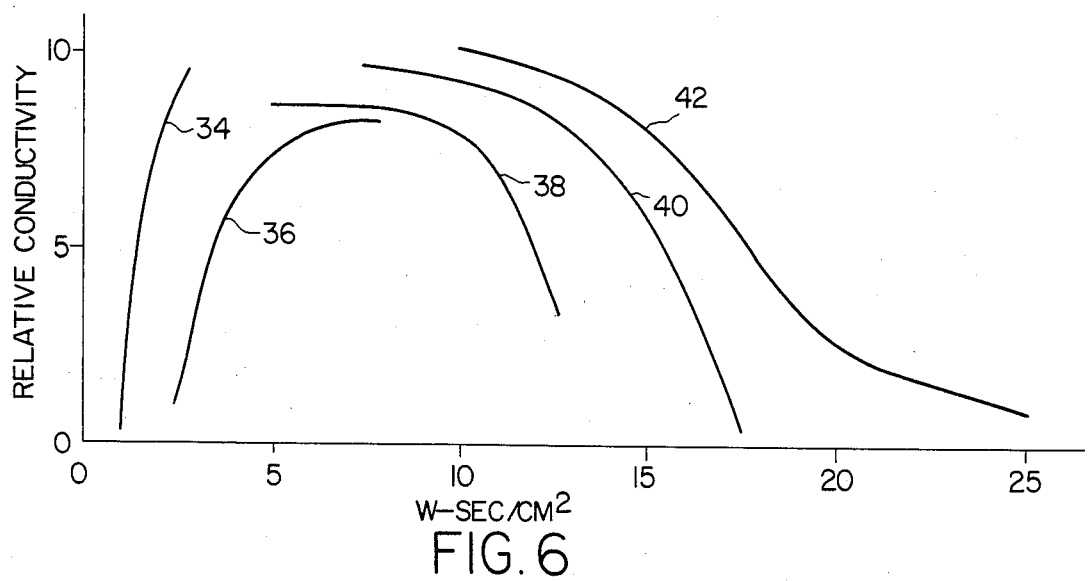
FIG. 6 shows the relative conductivity vs laser fluence for samples tested using five different exposure times.

To determine the effect of exposure time on conductivity, samples were irradiated for different times. The samples were prepared as described for Example 1 except that a concentration of 0.1M nickel acetate and 0.1M thiourea was used. The coated samples were exposed to a 3-inch by 3-inch laser beam at power densities of 10, 15, 20, and 25 W/cm$^2$. The results are shown in FIG. 6. The exposure times were: 0.1 sec for curve 34, 0.3 sec for curve 36, 0.5 sec for curve 38, 0.7 sec for curve 40, and 1.0 sec for curve 42.

Each exposure time produced a different curve. The 0.1 and 0.3 sec curves (34, 36) reached maximum conductivity at 25 W/cm$^2$. The 0.5 sec and 0.7 sec curves (38, 40) reached maximum conductivity for 10 W/cm$^2$, and passed maximum conductivity at 25 W/cm$^2$. The 1.0 sec curve (42) showed a drop-off in conductivity at a power density of 15 W/cm$^2$.

The curves in FIG. 6 show that the long exposure times produce a more gradual change in conductivity with change in fluence. This is true for both the increasing conductivity side of the curve (curves 34 and 36) and for the decreasing conductivity side (curves 38, 40, and 42).

EXAMPLE 6

A graded conductivity deposit was formed on a single fiberglass sample using the decreasing conductivity portion of curve 38 (FIG. 6). Test conditions were the same as in Example 5 except that the power density levels were varied between 10 to 17.5 W/cm² on the same fiberglass sample. As expected from curve 38, the lower levels produced the higher conductivities. These results for two trials are shown in the table below.

RESISTIVITY AND CURRENT DENSITY- OF LASER DEPOSITED NICKEL SULFIDE

| SUBSTRATE | RUN # | RESISTIVITY (ohms) | CURRENT DENSITY (A/cm$^2$) | SAMPLE THICKNESS (microns) | SAMPLE WIDTH (mm) |
| --- | --- | --- | --- | --- | --- |
| Kapton | 1 | 10,000 | 923 | 29.7 | .838 |
| Bakelite | 1 | 11,500 | 153 | 30 | 2.73 |
|  | 2 | 26,000 | 61.1 | 30 | 2.73 |
|  | 3 | 44,000 | 17.2 | 30 | 2.73 |
| Alumina | 1 | 14,750 | 1629 | 24.2 | .953 |
|  | 2 | 4,000 | 4715 | 22.5 | .876 |
|  | 3 | 6,250 | 3586 | 25.3 | 1.00 |

GRADING OF CONDUCTIVE DEPOSIT ON FIBERGLASS BY CO$_2$ LASER EXPOSURE 3″ × 3″ BEAM

| POWER LEVEL | Trial #1 Relative Conductivity | Trial #2 Relative Conductivity |
| --- | --- | --- |
| 17.5 W/CM$^2$ | 3.53 | 4.56 |
| 15 W/CM$^2$ | 4.18 | 4.95 |
| 12.5 W/CM$^2$ | 5.87 | 5.50 |
| 10 W/CM$^2$ | 7.92 | 8.52 |

EXAMPLE 7

The surface of a Kapton material sample was etched with chromic acid to provide a rough surface. A solution of nickel acetate and thiourea was spin-coated on the surface to provide an even coating. Conductive patterns including dots, hexagons, squares, and fine lines were then produced on the Kapton by exposing the coating to laser radiation through a mask placed on the coating. The conductive patterns produced by this process were very sharp indicating that the process should be well suited for the printed circuit industry.

EXAMPLE 8

Conductive patterns, such as crosses, have been formed on fiberglass coated as described in Example 1. A programmable table such fiberglass coated as described in Example 1. A programmable table such as shown in FIG. 1 was used to expose the coated surface to a focused laser beam and form fine-line conductive patterns on the fiberglass.

EXAMPLE 9

Semiconductive deposits of cadmium sulfide have been formed on fiberglass and Kapton substrates using the process as described in Examples 1 and 2 except that cadmium acetate rather than nickel acetate was used in the coating solution.

EXAMPLE 10

The process of the invention can be used to make resistors. Conductive deposits of nickel sulfide were formed on Kapton, Bakelite, and alumina substrates using the method described for Examples 1 and 2. Contacts were made to these deposits for measuring resistivity and peak current density. Peak current density is defined as the maximum current above which irreversible changes in resistivity occur through the cross-sectional area of the deposit. The results of these tests are shown in the table below.

While the above examples illustrate the deposition of nickel sulfide and cadmium sulfide using acetates of these metals, other salts of these metals which are capable of being converted to conductive or to semiconductive divalent metal compounds are also included within the invention. Such salts include sulfates, chlorides, nitrates, and tetrafluoroborates. Similarly other metals such as copper and cobalt which can form conductive or semiconductive sulfides are considered embodiments of this invention.

Likewise, the donor may be either a sulfur or a selenium donor selected from the sulfur group of the periodic table. Examples of sulfur donors include alkali metal thiosulfates, ammonum thiosulfates, alkali metal thiophosphates, ammonium thiophosphates, and thioacetamide. Examples of selenium donors include selenosulfates and trialkylphosphine selenides.

Although equal mole concentrations of the metal salt and sulfur donor have proven acceptable as shown in the examples above, other ratios might rove suitable for specific applications as can be readily determined using empirical tests. Likewise concentrations of the reactants as high as about 2 molar might be useful in some cases.

The exemplary laser radiation has proven very satisfactory for practicing the invention. However, other forms of radiation such as electron beam radiation can be used provided that sufficient energy can be obtained to form the metal sulfide and the beam can be positioned as required to define the desired pattern.

Numerous variations and combinations of ingredients can be made without departing from the invention. Accordingly, it should be understood that the form of the invention described above is illustrative and is not intended to limit the scope of the invention.

What is claimed is:

1. A method of producing an electrically conductive or semiconductive pattern on a substrate, which comprises:
   providing a substrate;
   providing a solution containing a soluble nickel salt capable of being converted to nickel sulfide, a sulfur donor, and a solvent;
   coating the surface of the substrate with the solution;
   evaporating solvent from the coated surface of the substrate;
   irradiating selected portions of the coated surface to form an electrically conductive pattern of nickel sulfide on the substrate.

2. The method as claimed in claim 1 wherein the substrate is a material selected from the group consisting of ceramic, metal, plastic, semiconductor, fiberglass, fiberglass reinforced Kapton, Kapton, Bakelite, alumina, and board for printed circuits.

3. The method as claimed in claim 1 wherein the solvent is water.

4. The method as claimed in claim 1 wherein the solvent is methanol.

5. The method as claimed in claim 1 wherein the soluble nickel salt is selected from the group consisting of nickel acetate tetrahydrate, nickel acetate, nickel sulfate, nickel chloride, nickel nitrate, and nickel tetrafluoroborate.

6. The method as claimed in claim 1 wherein the sulfur donor is selected from the group consisting of thiourea, alkali metal thiosulfates, ammonium thiosulfates, alkali metal thiophosphates, ammonium thiophosphates, and thioacetamide.

7. The method as claimed in claim 1 wherein the nickel salt concentration ranges from about 0.05 to about 2 molar, and the sulfur donor concentration ranges from about 0.05 to about 2 molar.

8. The method as claimed in claim 1 wherein the irradiating of selected portions comprises irradiating selected portions with a laser beam.

9. The method as claimed in claim 8 wherein the laser beam is a $CO_2$ laser having a power density of about 40 $W/cm^2$.

10. The method as claimed in claim 8 wherein the fluence of the laser radiation is in the range of about 1 W sec/$cm^2$ to about 25 W sec/$cm^2$.

11. The method as claimed in claim 8 wherein the fluence of the laser radiation is selected to obtain a desired conductivity in the irradiated portions of the coated substrate.

12. The method as claimed in claim 1 including washing the substrate to remove unreacted reagents from the surface.

13. The method as claimed in claim 1 wherein the substrate is etched prior to coating its surface with the solution.

14. A method of producing an electrically conductive pattern on a substrate, comprising:
provid a substrate;
providing a solution containing a soluble metal salt which is capable of being converted to a divalent metal compound selected from the group consisting of soluble salts of copper, cadmium, cobalt, and nickel, a donor selected from the sulfur group consisting of sulfur and selenium and a solvent;
coating the surface of the substrate with the solution;
evaporating solvent from the coated surface of the substrate;
irradiating selected portions of the coated surface to form an electrically conductive pattern of the divalent metal compound on the substrate.

15. A method of generating an electrically conductive pattern on a substrate comprising the steps of:
providing a substrate;
providing a solution of nickel acetate, thiourea, and a solvent;
coating the surface of the substrate with the solution;
evaporating solvent to leave a film of the nickel acetate and thiourea on the surface;
irradiating selected areas of the surface with a laser beam to form an electrically conducting pattern of nickel sulfide; and
washing the surface to remove unreacted portions of the film.

* * * * *